United States Patent
Feng et al.

(10) Patent No.: US 10,236,383 B2
(45) Date of Patent: Mar. 19, 2019

(54) METHOD FOR FABRICATING SEMICONDUCTOR DEVICE

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Chao-Hung Lin, Changhua County (TW); Chih-Kai Hsu, Tainan (TW); Yu-Hsiang Hung, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/916,261

(22) Filed: Mar. 8, 2018

(65) Prior Publication Data

US 2018/0197981 A1 Jul. 12, 2018

Related U.S. Application Data

(62) Division of application No. 14/703,904, filed on May 5, 2015, now Pat. No. 9,947,792.

(30) Foreign Application Priority Data

Apr. 7, 2015 (CN) .......................... 2015 1 0159728

(51) Int. Cl.
*H01L 29/04* (2006.01)
*H01L 29/78* (2006.01)
*H01L 29/66* (2006.01)

(52) U.S. Cl.
CPC ...... *H01L 29/785* (2013.01); *H01L 29/66795* (2013.01); *H01L 29/66803* (2013.01)

(58) Field of Classification Search
CPC ..... H01L 21/823431; H01L 21/823821; H01L 21/845; H01L 27/0886; H01L 27/0924; H01L 27/10826
USPC .......... 257/20, 194, 135–136, 213–413, 900, 257/902–903; 438/136, 137, 455–458, 438/149–165, 173, 192, 206, 212, 424, 438/427, 428, 591
See application file for complete search history.

(56) References Cited

U.S. PATENT DOCUMENTS 6,271,095 B1 8/2001 Yu
7,955,928 B2 6/2011 Chan et al.
(Continued)

FOREIGN PATENT DOCUMENTS

WO 2014204477 12/2014

OTHER PUBLICATIONS

Feng, Title of Invention: Semiconductor Device and Method for Fabricating the Same, U.S. Appl. No. 14/637,400, filed Mar. 4, 2015.

*Primary Examiner* — Moin M Rahman
(74) *Attorney, Agent, or Firm* — Winston Hsu

(57) ABSTRACT

A method for fabricating semiconductor device includes the steps of: providing a substrate having a first fin-shaped structure thereon; forming a spacer adjacent to the first fin-shaped structure; using the spacer as mask to remove part of the substrate for forming a second fin-shaped structure, wherein the second fin-shaped structure comprises a top portion and a bottom portion; and forming a doped portion in the bottom portion of the second fin-shaped structure.

6 Claims, 5 Drawing Sheets

(56) References Cited

U.S. PATENT DOCUMENTS

| | | | |
|---|---|---|---|
| 8,470,714 B1 | 6/2013 | Tsai | |
| 9,450,078 B1 | 9/2016 | Tang | |
| 2008/0265322 A1* | 10/2008 | Lin | H01L 21/28079 257/347 |
| 2009/0294840 A1* | 12/2009 | Gilgen | H01L 21/823431 257/327 |
| 2011/0278676 A1 | 11/2011 | Cheng | |
| 2012/0074468 A1 | 3/2012 | Yeh | |
| 2012/0241868 A1* | 9/2012 | Tsai | H01L 21/823807 257/369 |
| 2012/0299099 A1* | 11/2012 | Huang | H01L 29/66795 257/347 |
| 2013/0200470 A1 | 8/2013 | Liu | |
| 2013/0221448 A1 | 8/2013 | Chang | |
| 2013/0228875 A1 | 9/2013 | Lee | |
| 2014/0001562 A1 | 1/2014 | Liaw | |
| 2014/0061862 A1 | 3/2014 | Vega | |
| 2014/0124860 A1* | 5/2014 | Cheng | H01L 21/845 257/347 |
| 2015/0236015 A1 | 8/2015 | Jeong | |
| 2015/0263109 A1* | 9/2015 | Chen | H01L 21/76814 257/410 |
| 2016/0005868 A1 | 1/2016 | Wei | |

* cited by examiner

METHOD FOR FABRICATING SEMICONDUCTOR DEVICE

CROSS REFERENCE TO RELATED APPLICATIONS

This application is a division of U.S. application Ser. No. 14/703,904 filed May 5, 2015, and incorporated herein by reference in its entirety.

BACKGROUND OF THE INVENTION

1. Field of the Invention

The invention relates to a semiconductor device and fabrication method thereof, and more particularly, to an approach of utilizing solid state doping (SSD) technique to form doped region on the bottom portion of fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate having a first fin-shaped structure thereon; forming a spacer adjacent to the first fin-shaped structure; using the spacer as mask to remove part of the substrate for forming a second fin-shaped structure, in which the second fin-shaped structure comprises a top portion and a bottom portion; and forming a doped portion in the bottom portion of the second fin-shaped structure.

According to another aspect of the present invention, a semiconductor device is disclosed. The semiconductor device includes: a substrate; and a fin-shaped structure having a top portion and a bottom portion on the substrate, in which the top portion and the bottom portion comprise a step-shaped profile therebetween.

According to another aspect of the present invention, a semiconductor device is disclosed. The semiconductor device includes: a substrate; a fin-shaped structure having a top portion and a bottom portion on the substrate; and a doped region in the bottom portion of the fin-shaped structure, in which the doped region comprises a v-shaped profile.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
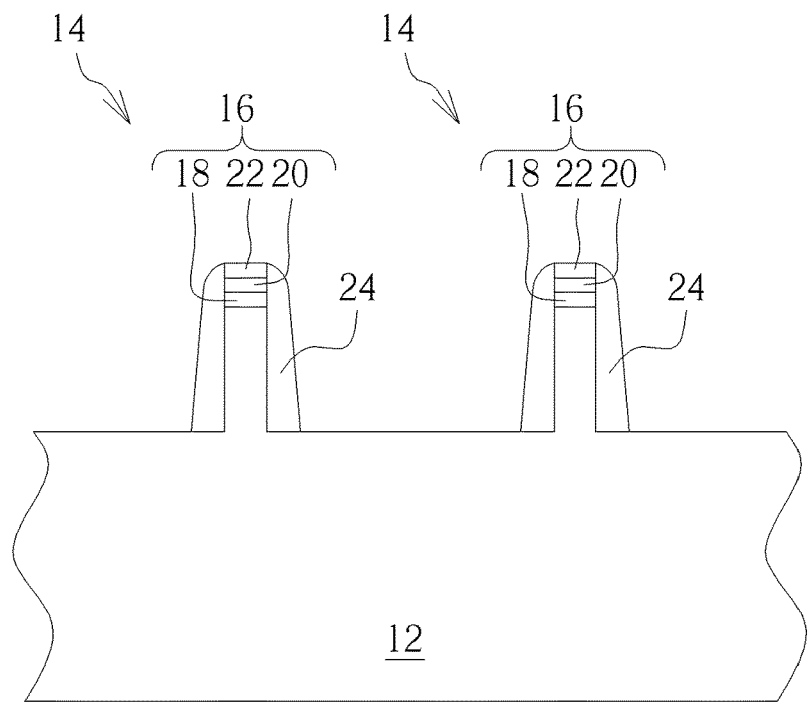
FIGS. 1-4 illustrate a method for fabricating semiconductor device according to a first embodiment of the present invention.

Referring to FIGS. 1-4, FIGS. 1-4 illustrate a method for fabricating semiconductor device according to a first embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 is formed on the substrate 12 and a mask layer 16 is formed on each fin-shaped structure 14. In this embodiment, the mask layer 16 could be a single-layered structure or a multi-layered structure, and the mask layer 16 is selected from the material consisting of $SiO_2$, SiN, SiON, and SiCN. The mask layer 16 of this embodiment is preferably a multi-layered structure composed of a silicon oxide layer 18, a silicon nitride layer 20, and another silicon oxide layer 22, but not limited thereto. Despite two fin-shaped structures 14 are disclosed in this embodiment, the quantity of the fin-shaped structures 14 could be adjusted according to the demand of the product.

The formation of the fin-shaped structures 14 could be accomplished by first forming a patterned mask (now shown) on the substrate, 12, and an etching process is performed to transfer the pattern of the patterned mask to the substrate 12. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 14. Moreover, if the substrate 12 were a SOI substrate, a patterned mask could be used to etch a semiconductor layer on the substrate until reaching a bottom oxide layer underneath the semiconductor layer to form the corresponding fin-shaped structure.

Next, a spacer 24 is formed adjacent to each fin-shaped structure 14. In this embodiment, the formation of the spacer 24 could be accomplished by first depositing a cap layer (not shown) on the substrate 12 to cover the fin-shaped structures 14 and mask layers 16 thereon, and an etching back process is conducted to remove part of the cap layer for forming the spacer 24 adjacent to each of the fin-shaped structures 14.

Figure 2:
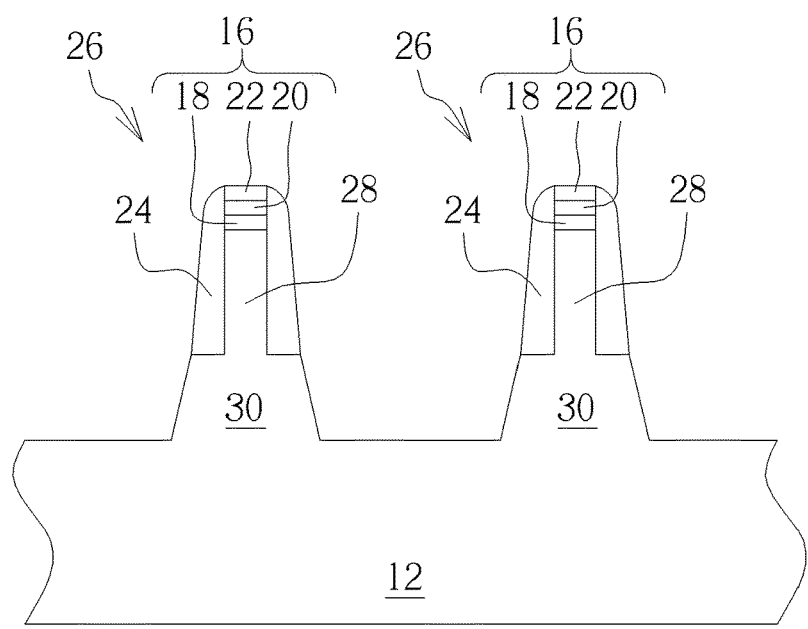

Next, as shown in FIG. 2, an etching process is conducted by using the mask layer 16 and spacer 24 as mask to remove part of the substrate 12 for forming fin-shaped structures 26, in which each of the fin-shaped structures 26 includes a top portion 28 and a bottom portion 30. Specifically, each spacer 24 is preferably disposed around the top portion 28 of each fin-shaped structure 26 while the bottom portion 30 is exposed completely. In this embodiment, the height between the top surface of the mask layer 16 to the bottom surface of the top portion 28 is approximately between 300 Angstroms to 700 Angstroms, or more preferably about 500 Angstroms, and the height between the top surface of the mask layer 16 to the bottom of the substrate 12 is approximately between 800 Angstroms to 2000 Angstroms, or more preferably about 1300 Angstroms.

Figure 3:
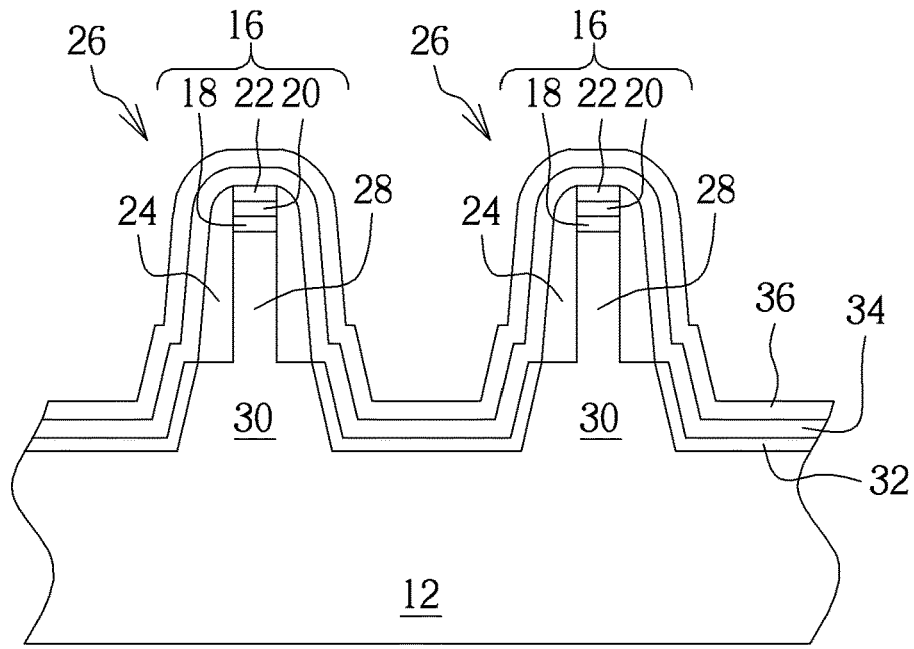

Next, as shown in FIG. 3, a liner 32 is selectively formed on the bottom portion 30 of each fin-shaped structure 26, a doped layer 34 is formed on the substrate 12, liner 32, spacer 24, and mask layer 16, and a hard mask 36 is formed on the doped layer 34 thereafter. In this embodiment, the liner 32 is preferably composed of silicon nitride and the material of the doped layer 34 could be adjusted depending on the type of transistor being fabricated afterwards. For instance, if a NMOS transistor were to be fabricated, the doped layer 34 is preferably composed of thin film containing p-type dopants, such as borosilicate glass (BSG). Conversely, if a PMOS transistor were to be fabricated, the doped layer 34 is preferably composed of thin film containing n-type dopants, such as phosphosilicate glass (PSG). The hard mask 36 could be selected from the group consisting of $SiO_2$, SiN, SiON, and SiCN, but not limited thereto.

Figure 4:
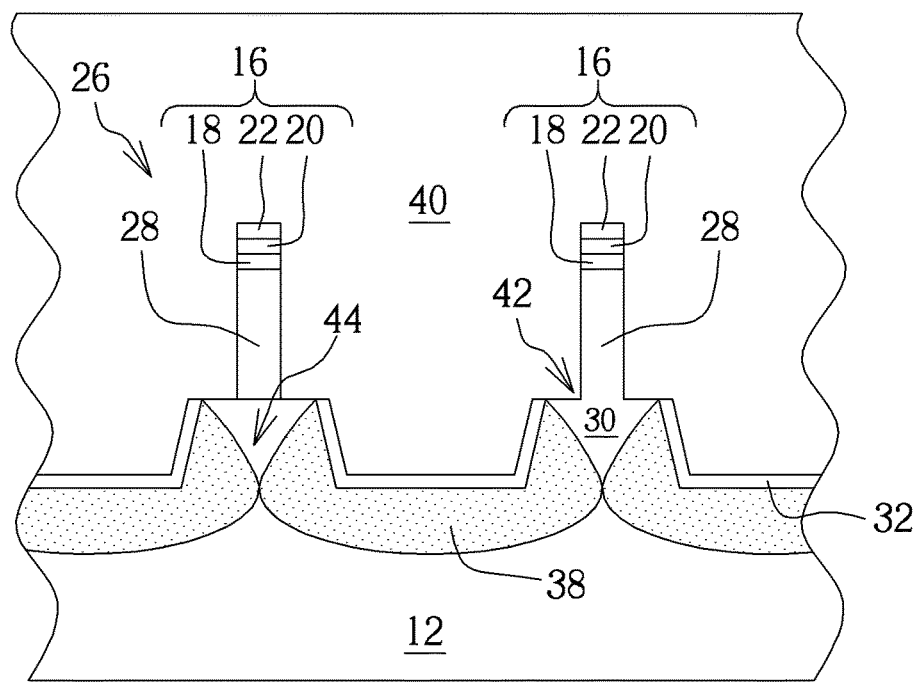

Next, as shown in FIG. 4, an annealing process is conducted after forming the hard mask 36 to drive dopants from the doped layer 34 into the bottom portion 30 of each fin-shaped structure 26 for forming a doped region 38, such as an anti-punch-through (APT) layer for preventing current leakage. It should be noted that since a spacer 24 is formed adjacent to the sidewalls of the top portion 28 of each fin-shaped structure 26 prior to the annealing process, the doped region 38 formed in the bottom portion 30 of each fin-shaped structure 26 after the annealing process preferably includes a v-shaped profile 44.

Next, the hard mask 36, doped layer 34, and spacer 24 could be removed entirely while retaining the liner 32, or the liner 32 could be removed along with the hard mask 36, doped layer 34, and spacer 24, and another liner (not shown) could be formed on the surface of the exposed fin-shaped structure 26 thereafter. Next, a flowable chemical vapor deposition (FCVD) process is conducted to form a dielectric layer 40 composed of silicon oxide on the fin-shaped structures 26. In his embodiment, the removal of the hard mask 36, doped layer 34, and spacer 24 could be accomplished by using phosphoric acid to remove the hard mask 34, using diluted hydrofluoric acid (DHF) to remove the doped layer 34, and then using phosphoric acid again to remove the spacer 24. Alternatively, a SiCoNi clean could be conducted to remove the hard mask 36, doped layer 34, and spacer 24 in one single step, which is also within the scope of the present invention. Next, additional etching and/or chemical mechanical polishing (CMP) process is conducted to remove part of the dielectric layer 40 for forming a shallow trench isolation (STI), and transistor elements such as gate structures and source/drain regions could be fabricated thereafter according to the demand of the product. This completes the fabrication of a semiconductor device according to a first embodiment of the present invention.

Referring again to FIG. 4, FIG. 4 further illustrates a structural view of a semiconductor device according to an embodiment of the present invention. As shown in FIG. 4, the semiconductor device includes a substrate 12, at least a fin-shaped structure 26 disposed on the substrate 12, in which the fin-shaped structure 26 includes a top portion 28 and a bottom portion 30. Preferably, the bottom portion 30 includes at least a slanted sidewall, and the top portion 28 and bottom portion 30 include a step-shaped profile 42 therebetween. More specifically, the top portion 28 of the fin-shaped structure 26 includes a top surface and a bottom surface, and the bottom portion 30 also includes a top surface and a bottom surface, in which the width of the bottom surface of the top portion 28 is preferably less than the width of the top surface of the bottom portion 30 so that the sidewalls of the top portion 28 and the top surface of the bottom portion 30 includes the step-shaped profile 42.

Moreover, at least a doped region 38 having v-shaped profile 44 is also formed in the bottom portion 30 of the fin-shaped structure 26, in which the doped region 38 is composed of boron or phosphorus. For instance, if the semiconductor device fabricated were NMOS transistor, the doped region 38 preferably includes boron, whereas if the semiconductor device fabricated were PMOS transistor, the doped region 38 preferably includes phosphorus.

Figure 5:
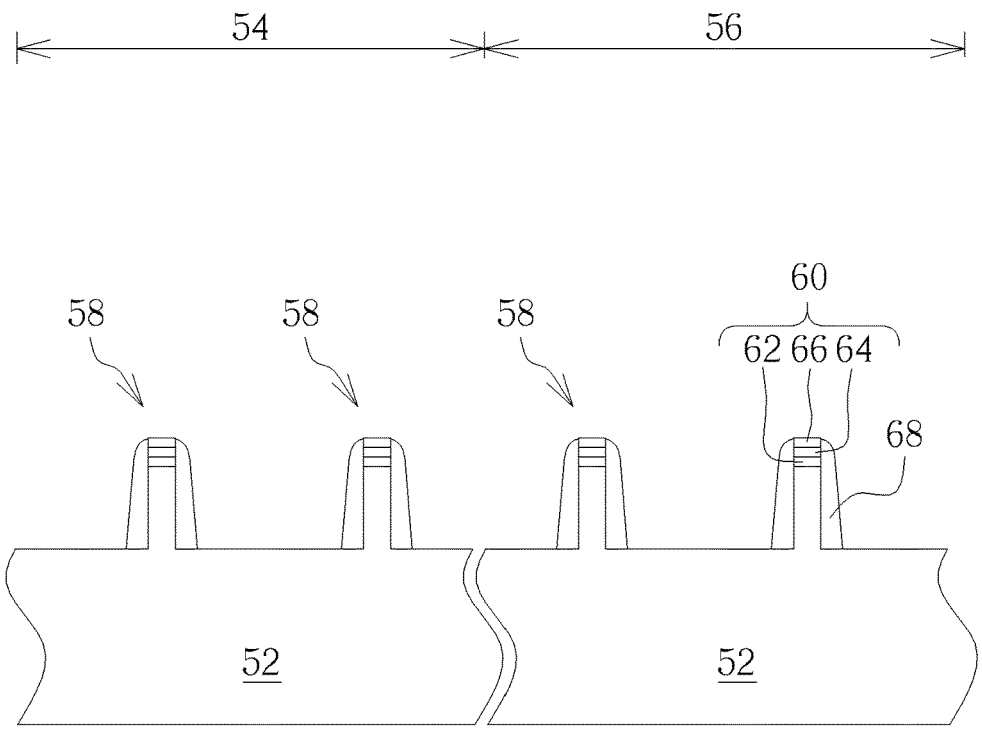
FIGS. 5-10 illustrate a method for fabricating semiconductor device according to a second embodiment of the present invention.

Referring to FIGS. 5-10, FIGS. 5-10 illustrate a method for fabricating semiconductor device according to a second embodiment of the present invention. As shown in FIG. 5, a substrate 52, such as a silicon substrate or silicon-on-insulator (SOI) substrate is provided, and a NMOS region 54 and a PMOS region 56 are defined on the substrate 52. At least one fin-shaped structure 58 is formed on the NMOS region 54 and PMOS region 56 respectively, and a mask layer 60 is formed on each fin-shaped structure 58. In this embodiment, the mask layer 60 could be a single-layered structure or a multi-layered structure, and the mask layer 60 is selected from the material consisting of $SiO_2$, SiN, SiON, and SiCN. The mask layer 60 of this embodiment is preferably a multi-layered structure composed of a silicon oxide layer 62, a silicon nitride layer 64, and another silicon oxide layer 66, but not limited thereto. Despite two fin-shaped structures 58 are disposed on each NMOS region 54 and PMOS region 56 in this embodiment, the quantity of the fin-shaped structures 58 could be adjusted according to the demand of the product.

Next, a spacer 68 is formed adjacent to each of the fin-shaped structures 58. Similar to the aforementioned embodiment, the formation of the spacers 68 could be accomplished by first depositing a cap layer (not shown) on the substrate 52 to cover the fin-shaped structures 58 and mask layer 60, and an etching back process is conducted to remove part of the mask layer to form a spacer 68 around each fin-shaped structures 58.

Figure 6:
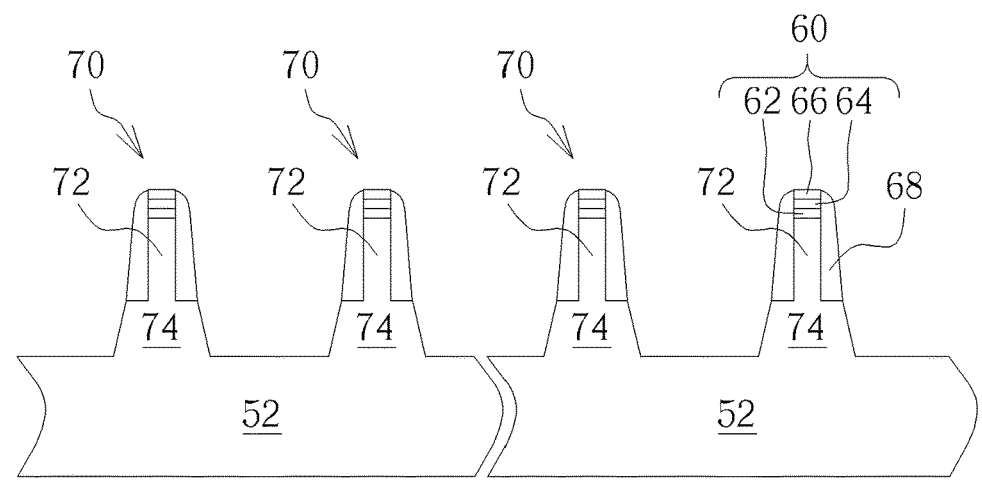

Next, as shown in FIG. 6, an etching process is conducted by using the mask layers 60 and spacers 68 as mask to remove part of the substrate 52 on both NMOS region 54 and PMOS region 56 to form fin-shaped structures 70, in which each of the fin-shaped structures includes a top portion 72 and a bottom portion 74. More specifically, the spacers 68 are disposed around the top portions 72 of each fin-shaped structure 70 while the bottom portions 74 are exposed.

Figure 7:
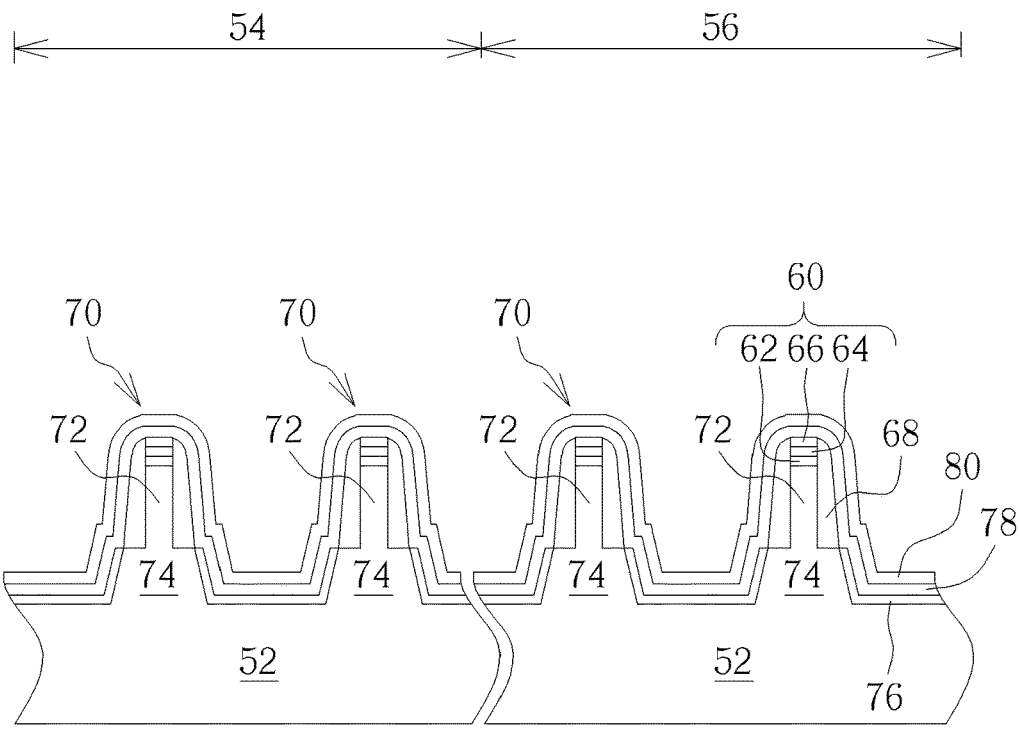

Next, as shown in FIG. 7, a liner 76 is selectively formed on the bottom portions 74 of each fin-shaped structure 70, an a doped layer 78 is formed on the substrate 52, liner 76, spacers 68, and mask layer 60, and a hard mask 80 is formed on the doped layer 78 thereafter. In this embodiment, the liner 76 is preferably composed of silicon nitride and the doped layer 78 is preferably composed of material containing p-type dopants such as BSG. The hard mask 80 could be selected from the group consisting of $SiO_2$, SiN, SiON, and SiCN, but not limited thereto.

Figure 8:
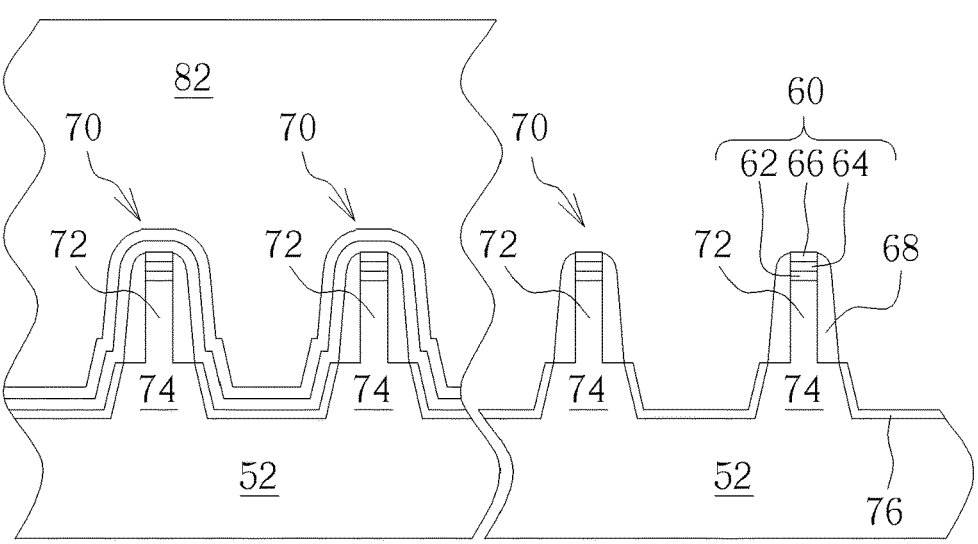

Next, as shown in FIG. 8, a patterned resist 82 is formed on the NMOS region 54, and an etching process is conducted by using the patterned resist 82 as mask to remove the hard mask 80 and doped layer 78 from PMOS region 56 for exposing the mask layer 60, spacer 68, and liner 76 on the same region 56.

Figure 9:
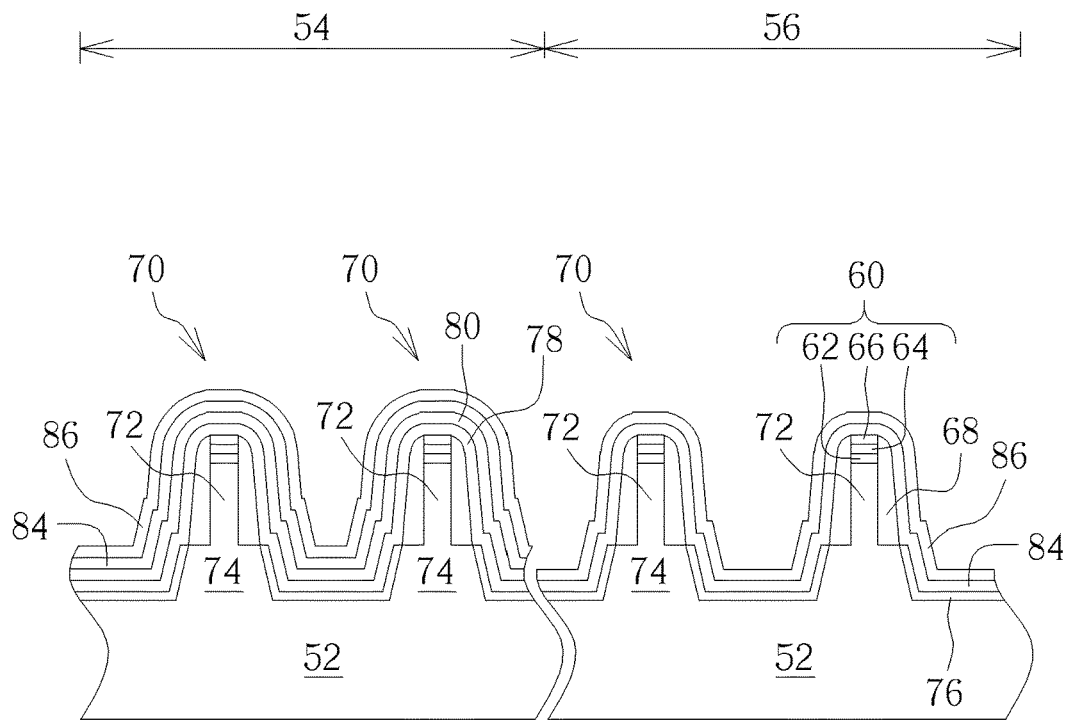

Next, as shown in FIG. 9, after stripping the patterned resist 82, another doped layer 84 and another hard mask 86 deposited on the fin-shaped structures 70 of both NMOS region 54 and PMOS region 56, in which the hard mask 86 and doped layer 84 on NMOS region 54 are disposed on the hard mask 80 formed previously while the hard mask 86 and doped layer 84 on PMOS region 56 are disposed on the exposed mask layer 60, spacers 68, and liner 76. The doped layer 84 at the stage is preferably composed of material containing n-type dopants such as PSG, and the hard mask 86 could be composed of material the same as or different from the hard mask 80, such as a material selected from the group consisting of $SiO_2$, SiN, SiON, and SiCN, but not limited thereto.

Despite the embodiment from FIGS. 7-9 forms the doped layer 78 composed of BSG and hard mask 80 on both NMOS region 54 and PMOS region 56, removes the hard mask 80 and doped layer 78 from PMOS region 56, and then forms a doped layer 84 composed of PSG and hard mask 86 on NMOS region 54 and PMOS region 56, it would also be desirable to form a doped layer composed of PSG and hard mask on NMOS region 54 and PMOS region 56, remove the hard mask and doped layer from NMOS region 54, and then form a doped layer composed of BSG and hard mask on NMOS region 54 and PMOS region 56, which is also within the scope of the present invention.

Figure 10:
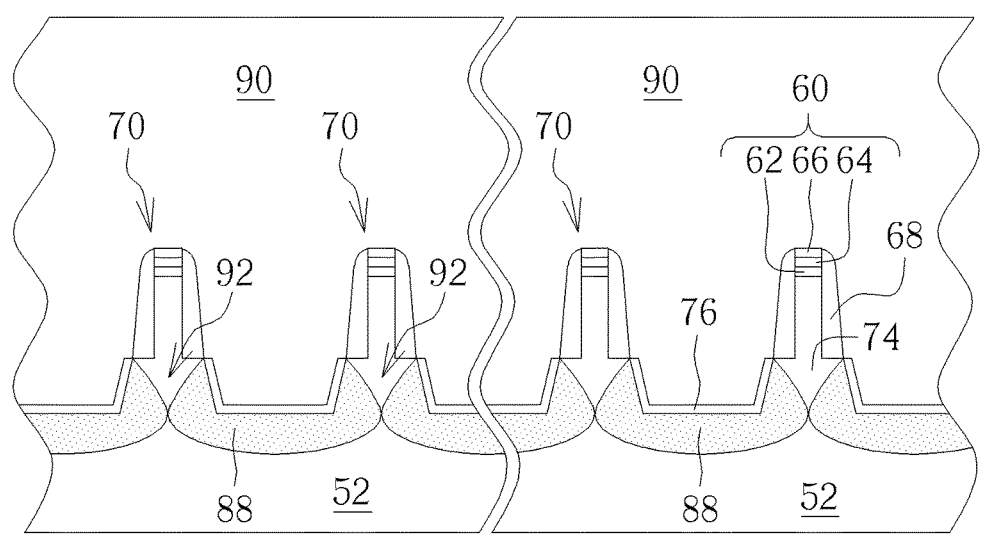

Next, as shown in FIG. 10, an annealing process is conducted to drive dopants from the doped layers 78 and 84 into the bottom portions 74 of each fin-shaped structure 70 on NMOS region 54 and PMOS region 56 for forming a doped region 88, such as an anti-punch-through (APT) layer having v-shaped profile 92 for preventing current leakage. Next, hard mask 86, doped layer 84, hard mask 80, doped layer 78, and spacers 68 could be removed entirely while retaining the liner 76, or the liner 76 could be removed along with hard mask 86, doped layer 84, hard mask 80, doped layer 78, and spacers 68, and another liner (not shown) could be formed on the surface of the exposed fin-shaped structure 70 thereafter. Next, a FCVD process is conducted to form a dielectric layer 90 composed of silicon oxide on the fin-shaped structures 70. Next, additional etching and/or chemical mechanical polishing (CMP) process is conducted to remove part of the dielectric layer 90 for forming a shallow trench isolation (STI), and transistor elements such as gate structures and source/drain regions could be fabricated thereafter according to the demand of the product. This completes the fabrication of a semiconductor device according to a second embodiment of the present invention.

Overall, the present invention discloses an approach of applying solid-state doping (SSD) technique on a FinFET device, which preferably forms a first fin-shaped structure on the substrate, forms a spacer adjacent to the first fin-shaped structure, uses the spacer as mask to remove part of the substrate for forming a second fin-shaped structure, forms a doped layer on the bottom portion of second fin-shaped structure, and then performs an annealing process to drive dopants from the doped layer into the bottom portion of the fin-shaped structure and/or substrate. This forms an anti-punch-through (APT) layer for resolving current leakage issue of the device. In this embodiment, the material of the doped layer could be adjusted depending on the type of transistor being fabricated. For instance, if NMOS transistor were to be fabricated, the doped layer is preferably composed of BSG whereas if PMOS transistor were to be fabricated, the doped layer is preferably composed of PSG.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first fin-shaped structure thereon;
    forming a spacer adjacent to the first fin-shaped structure;
    using the spacer as mask to remove part of the substrate for forming a second fin-shaped structure, wherein the second fin-shaped structure comprises a top portion and a bottom portion;
    forming a doped layer on the substrate, the spacer, and the second fin-shaped structure; and
    performing an anneal process to drive dopants from the doped layer into the bottom portion for forming a doped portion in the bottom portion of the second fin-shaped structure.

2. The method of claim 1, wherein the first fin-shaped structure comprises a mask layer thereon, the method comprises:
    using the mask layer and the spacer as mask to remove part of the substrate for forming the second fin-shaped structure.

3. The method of claim 2, further comprising:
    forming a liner on the bottom portion of the second fin-shaped structure; and
    forming a hard mask on the doped layer.

4. The method of claim 3, wherein the liner comprises silicon oxide.

5. The method of claim 3, wherein the doped layer comprises borosilicate glass (BSG) or phosphosilicate glass (PSG).

6. The method of claim 3, further comprising:
    performing the annealing process after forming the hard mask to form the doped region in the bottom portion of the second fin-shaped structure; and
    removing the hard mask, the doped layer, and the spacer.

* * * * *